(12) United States Patent
Scholz

(10) Patent No.: US 7,358,744 B2
(45) Date of Patent: Apr. 15, 2008

(54) METHOD FOR TESTING THE SERVICEABILITY OF TRANSDUCERS

(75) Inventor: Wolfang Scholz, Minden (DE)

(73) Assignee: ABB Patent GmbH, Ladenburg (DE)

( * ) Notice: Subject to any disclaimer, the term of this patent is extended or adjusted under 35 U.S.C. 154(b) by 0 days.

(21) Appl. No.: 11/526,422

(22) Filed: Sep. 25, 2006

(65) Prior Publication Data

US 2007/0108925 A1 May 17, 2007

(30) Foreign Application Priority Data

Oct. 6, 2005 (DE) .................. 10 2005 047 894

(51) Int. Cl.
*G01R 31/08* (2006.01)
(52) U.S. Cl. ..................... 324/522; 324/527
(58) Field of Classification Search ............ 324/522, 324/527
See application file for complete search history.

(56) References Cited

U.S. PATENT DOCUMENTS 5,347,841 A * 9/1994 Enzinna ................ 73/1.88
5,437,178 A * 8/1995 Esin et al. ............. 73/1.82
6,967,486 B2 * 11/2005 Schneider .............. 324/503
7,042,228 B2 * 5/2006 Lally et al. ............. 324/527

* cited by examiner

*Primary Examiner*—Andrew H. Hirshfeld
*Assistant Examiner*—Amy He
(74) *Attorney, Agent, or Firm*—Paul R. Katterle; Michael C. Prewitt

(57) ABSTRACT

The invention relates to a two-wire transducer in automation engineering that outputs a measurement signal as an injected current. For the method to test the serviceability, it is proposed to increase the DC loop current ($I_S$), independently of the measured value, from the minimum value towards the maximum value ($I_{SM}$), and to measure the input voltage ($U_E$) across the internal resistance of the transducer in the process, and to compare it with a definable threshold value ($U_{ES}$) that is greater than the minimum input voltage ($U_{EM}$) required to maintain serviceability. If the input voltage ($U_E$) falls below the threshold value ($U_{ES}$) before the DC loop current ($I_S$) has reached its maximum value ($I_{SM}$), the DC loop current ($I_S$) is reduced until the input voltage ($U_E$) reaches at least the definable threshold value ($U_{ES}$), and the error is signaled.

10 Claims, 2 Drawing Sheets

METHOD FOR TESTING THE SERVICEABILITY OF TRANSDUCERS

CROSS REFERENCE TO RELATED APPLICATION

This application claims priority from German Application DE 10 2005 047 894.8 filed on Oct. 6, 2005 the contents of which are relied upon and incorporated herein by reference in their entirety, and the benefit of priority under 35 U.S.C. 119 is hereby claimed.

BACKGROUND OF THE INVENTION

The invention relates to a method for testing the serviceability of two-wire transducers in automation engineering that output a measurement signal as an injected current.

The transducer in this case is located remotely in the field environment, local to the process, and is equipped with sensor means for detecting a physical process variable and means for converting it into an electrical variable.

For a multiplicity of transducers, means are kept in a central control area for supplying them with power and for measured-value processing and visualization in the control area.

In a two-wire transducer, both the supply of electrical power to the active components of the transducer and the transmission of the measured values to the means for measured-value processing and visualization in the control area are implemented via a single two-wire line between the transducer in the field environment and a transducer power supply unit located in the control area.

For this purpose, a current loop starting from a voltage source arranged in the transducer power supply unit is formed via the first wire of the two-wire line, the internal resistance of the transducer, the second wire of the two-wire line, and a measuring resistor arranged in the transducer power supply unit, with the loop current of said loop being set by appropriate variation of the internal resistance of the transducer depending on the detected process variable. The voltage drop across the measuring resistor is then a measure of the detected process variable of the transducer.

A minimum input voltage is required across the internal resistance of the transducer to supply the active components of the transducer with power. If the line impedance is too large and/or the output voltage from the transducer power supply unit is too low, a high loop current, whose value depends on the detected process variable, results in a high voltage drop across the two-wire line, with the required minimum input voltage of the transducer not reached in the steady state.

It is particularly problematic that this effect normally remains initially undiscovered when the transducer is put into service, and does not appear until high loop currents occur in the long term.

SUMMARY OF THE INVENTION

The object of the invention is hence to improve a generic transducer for checking it is serviceable.

The invention is based on a transducer of the type in question, in which both the supply of electrical power to the active components of the transducer and the analog communication with the means for measured-value processing and visualization in the control area are performed via a single two-wire line between the transducer in the field environment and a transducer power supply unit located in the control area, where the analog communication is made in one direction from the transducer in the field environment to the means for measured-value processing and visualization in the control area, and is represented via the DC loop current.

According to the invention, the DC loop current is increased, independently of the measured value, from the minimum value towards the maximum value, and the input voltage across the internal resistance of the transducer is measured in the process. If the input voltage falls below a definable threshold value that is greater than the minimum input voltage required to maintain serviceability, before the loop current has reached its maximum value, this situation is judged to be an error. If an error is detected, the DC loop current is reduced until the input voltage reaches at least the definable threshold value, thereby signaling an error.

This test is advantageously performed when the transducer is put into service or whenever the transducer supply voltage is switched on. The loss of serviceability because of insufficient operating voltage during the subsequent intended use of the transducer is thereby advantageously avoided.

Alternatively, it can be provided to perform this test as required during the intended use of the transducer, where the requirement can be initiated by alarms and/or error messages that have occurred as a result of irregularities or unexpected responses of the automation engineering installation or parts thereof. In this case, detected or suspected errors in the automation engineering installation can advantageously be located or at least isolated.

In addition, it can be provided to perform this test periodically. In particular, measurement intervals between two successive measurement actions are suitable for this. Errors in the automation engineering installation that have occurred during use are thereby advantageously discovered as a preventive measure.

According to a further feature of the invention, the loop current is increased continuously from the minimum value to the maximum value. This advantageously makes it possible to increase the loop current from the minimum value to the maximum value in a technically simple manner.

According to an alternative feature of the invention, the loop current is increased incrementally from the minimum value to the maximum value, where the number of steps can be customized to suit the given transducer.

According to an embodying feature of the invention, each step in loop current is held until the measured input voltage across the internal resistance of the transducer remains constant. The advantageous effect of this for transducers having capacitive energy storage elements in the excitation circuit is that the measured input voltage across the internal resistance of the transducer actually corresponds to the loop current.

According to a further feature of the invention, it is indicated at the transducer if the threshold value is not reached. The detected error is thereby indicated immediately to the local operating staff, in particular when putting the transducer into service. Consequently, the fact that the transducer concerned is not serviceable is detected while it is still being put into service, thereby avoiding a transducer that is not serviceable from being put into intended use.

In a particular embodiment of the invention, a DC-compensated AC signal is used to signal to means for measured-value processing and visualization in the control area if the threshold value is not reached. The generic transducer is equipped for this purpose with means for digital communication with the means for measured-value processing and visualization in the control area. The digital communication is performed bi-directionally between the transducer in the field environment and the means for measured-value processing and visualization in the control area by means of a DC-compensated AC signal.

By using a DC-compensated AC signal for transmitting the signal, any effect of the DC loop current on the two-wire line and hence on the input voltage across the internal resistance of the transducer is advantageously avoided. The detected error is thereby immediately indicated to the remote operating staff, in particular for transducer testing performed as required or periodically. Consequently, the fact that the transducer concerned is not serviceable is detected immediately, thereby avoiding the intended use of a transducer that is not serviceable.

BRIEF DESCRIPTION OF THE DRAWING

The invention is explained in more detail below with reference to an exemplary embodiment. In the drawings required for this purpose.

FIG. 1 shows an equivalent circuit of a transducer excitation circuit to the extent required to explain the present invention.

DETAILED DESCRIPTION OF ILLUSTRATIVE EMBODIMENTS

Figure 1:
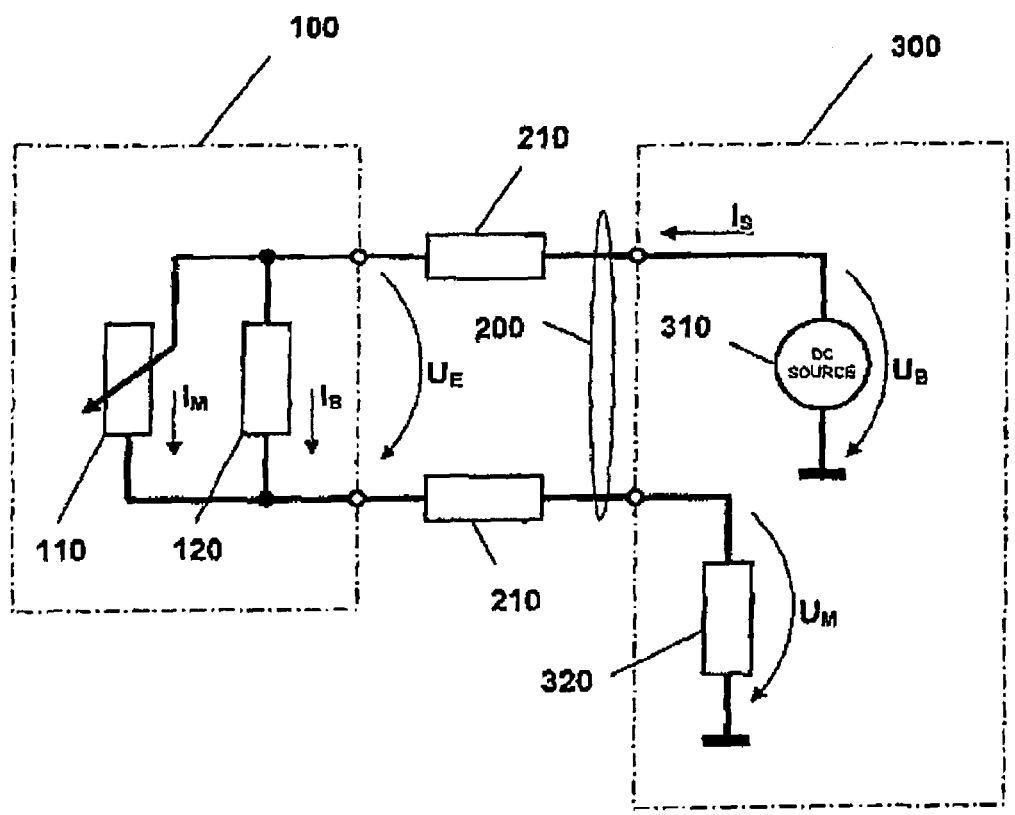
FIG. 1 shows an equivalent circuit of a transducer excitation circuit

A transducer 100 is connected via a two-wire line 200 to a transducer power supply unit 300 located in the control area. The transducer power supply unit 300 comprises at least one DC voltage source 310 having an operating voltage $U_B$ and a measuring resistor 320. A conductor loop is taken as a mesh from the DC voltage source 310 via the two-wire line 200, transducer 100 and the measuring resistor 320.

The two-wire line 200 has for each wire a line resistance 210 that depends on the cross-section and length of the line.

The transducer 100 has an internal resistance formed by the parallel connection of a fixed internal resistance 120 and a variable internal resistance 110. The fixed internal resistance 120 here represents the loading of the conductor-loop circuit by the active components of the transducer 100 given by the operating current $I_B$. The operating current $I_B$ is kept constant during the intended use of the transducer 100.

The transducer 100 is equipped with sensor means (not shown) for detecting a physical process variable and means for converting it into an electrical variable.

During intended use of the transducer 100, the electrical variable is impressed as a measurement current $I_M$ on a DC loop current $I_S$ via the variable internal resistance 110.

The DC loop current $I_S$ flows through the line resistances 210 of the two-wire line 200, the transducer 100 and the measuring resistor 320. In the transducer 100, the DC loop current $I_S$ is split into the fixed operating current $I_B$ and the variable measurement current $I_M$.

Figure 2:
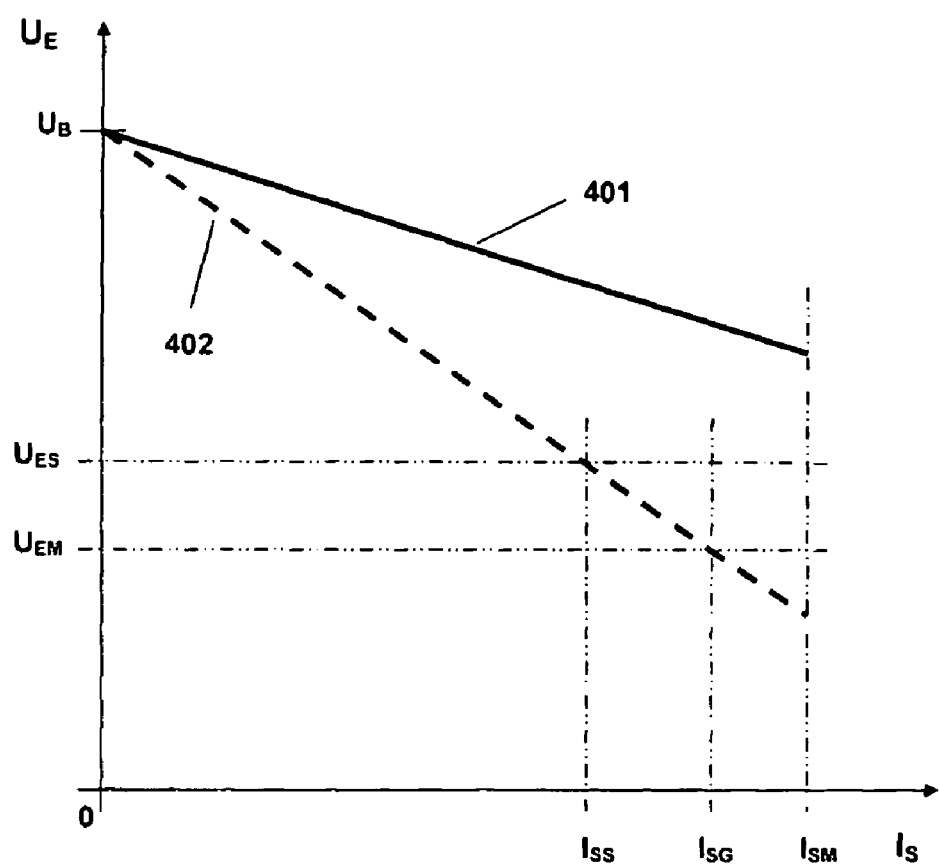
FIG. 2 shows a current/voltage graph of serviceability characteristic curves.

The flow of the DC loop current $I_S$ produces a voltage drop across the measuring resistor 320, which as a measurement voltage $U_M$ represents the detected measured value, after subtracting the portion of the voltage drop caused by the operating current $I_B$ An input voltage $U_E$ appears across the terminals of the transducer 100 for the two-wire line 200 that depends on the operating voltage $U_B$ of the DC voltage source 310, the injected DC loop current $I_S$ and the sum of the measuring resistor 320 and the line resistances 210. Referring to FIG. 2, a minimum input voltage $U_{EM}$ is required across the internal resistance of the transducer 100 for the serviceable supply of power to the active components of the transducer 100. If the line resistances 210 of the two-wire line 200 are too large and/or the operating voltage $U_B$ from the DC voltage source 310 of the transducer power supply unit 300 is too low, a high DC loop current $I_S$ whose value depends on the detected process variable results in such a high voltage drop across the line resistances 210 of the two-wire line 200 that the required minimum input voltage $U_{EM}$ of the transducer 100 is not reached in the steady state.

FIG. 2 shows a graph illustrating this, in which the input voltage $U_E$ is plotted against the DC loop current $I_S$ for a first characteristic curve 401 and a second characteristic curve 402. The first characteristic curve 401 shows the voltage characteristic of the input voltage $U_E$ of a serviceable transducer 100. As the first characteristic curve 401 shows, the input voltage $U_E$ is always greater than the definable threshold value $U_{ES}$ of the input voltage $U_E$, even at the maximum value $I_{SM}$ of the DC loop current $I_S$, and hence also greater than the minimum input voltage $U_{EM}$. By contrast, the second characteristic curve 402 shows the voltage characteristic of the input voltage $U_E$ of a transducer 100 that is not fully serviceable. As soon as the DC loop current $I_S$ exceeds a limit current $I_{SG}$, the input voltage $U_E$ drops below the required minimum input voltage $U_{EM}$, and the transducer 100 switches off.

To test the serviceability, according to the invention the DC loop current $I_S$ is increased independently of the measured value, by the variable internal resistance 110, from the minimum value towards the maximum value $I_{SM}$, and the input voltage $U_E$ across the internal resistances 110 and 120 of the transducer 100 is measured in the process. If the input voltage $U_E$ falls below a definable threshold value $U_{ES}$, which is greater than the minimum input voltage $U_{EM}$ required to maintain serviceability, before the loop current $I_S$ has reached its maximum value $I_{SM}$, this situation is judged to be an error. If an error is detected, the DC loop current $I_S$ is reduced until the input voltage $U_E$ reaches at least the definable threshold value $U_{ES}$, and the error is signaled.

This test is advantageously performed for the first time back when the transducer is put into service, where it is particularly advantageous to invoke the test procedure automatically during the process of putting into service. In this case it is also established that the transducer 100 is unserviceable when a DC loop current $I_S$ cannot be initiated at its maximum value $I_{SM}$ owing to the currently measurable physical variable. In addition, the detected error is indicated immediately to the local operating staff.

Capacitive storage elements are commonly used to stabilize the operating voltage for the active components of the transducer 100. In a particular embodiment of the invention, the DC loop current $I_S$ is hence increased incrementally from the minimum value to the maximum value $I_{SM}$, where the number of steps can advantageously be customized to suit the given transducer 100. In this case, each step in loop current is held until the measured input voltage $U_E$ across the internal resistances 110 and 120 of the transducer 100 remains constant.

The advantageous effect of this for transducers 100 having capacitive energy storage elements in the excitation circuit is that the measured input voltage $U_E$ across the internal resistances 110 and 120 of the transducer 100 actually corresponds to the associated DC loop current $I_S$.

In a further advantageous embodiment of the invention, it can be provided to perform this test as required and/or periodically during the intended use of the transducer 100, where the requirement can be initiated by alarms and/or error messages that have occurred as a result of irregularities or unexpected responses of the automation engineering installation or parts thereof. In particular, measurement intervals between two successive measurement actions are suitable for this.

In a particular embodiment of the invention, a DC-compensated AC signal is used to signal to means for measured-value processing and visualization in the control area that the threshold value is not reached. The generic transducer 100 is equipped for this purpose with means (not shown) for digital communication with the means for measured-value processing and visualization in the control area. The digital communication is performed bi-directionally between the transducer 100 in the field environment and the means for measured-value processing and visualization in the control area by means of a DC-compensated AC signal.

In particular, the FSK technique (frequency shift keying) commonly used in automation engineering installations is suitable for this, in which switching between a frequency for representing a logical zero and another frequency for representing a logical one is alternately performed according to the bitstream to be transmitted.

In addition, the transmission can be based on a transmission protocol, where in particular the HART protocol and various field buses are commonly used for communication in automation engineering installations.

By using a DC-compensated AC signal for transmitting the signal, any effect of the DC loop current $I_S$ on the two-wire line 200 and hence on the input voltage $U_E$ across the internal resistances 110 and 120 of the transducer 100 is advantageously avoided. The detected error is thereby immediately indicated to the remote operating staff, in particular for the testing of the transducer 100 performed as required or periodically. Consequently, the fact that the transducer 100 concerned is not serviceable is detected immediately, thereby avoiding the intended use of a transducer 100 that is not serviceable.

What is claimed is:

1. A method for testing the serviceability of two-wire transducers in automation engineering that output a measurement signal as an injected DC loop current via a two-wire line, and whose active components are supplied with electrical power via the same two-wire line, wherein the DC loop current ($I_S$) is increased, independently of the measurement signal, from a minimum value towards a maximum value ($I_{SM}$), and an input voltage ($U_E$) across the internal resistance (110,120) of the transducer (100) is measured in the process the input voltage ($U_E$) is compared with a definable threshold value ($U_{ES}$) that is greater than a minimum input voltage ($U_{EM}$) required to maintain serviceability, and the DC loop current ($I_S$) is reduced until the input voltage ($U_E$) reaches at least the definable threshold value ($U_{ES}$), and a signal is given if the input voltage ($U_E$) falls below the threshold value ($U_{ES}$) before the DC loop current ($I_S$) has reached its maximum value ($I_{SM}$).

2. The method as claimed in claim 1, wherein the test is performed when the transducer (100) is put into service.

3. The method as claimed in claim 1, wherein the test is performed as required during the intended use of the transducer (100).

4. The method as claimed in claim 1, wherein the test is performed periodically.

5. The method as claimed in claim 4, wherein the test is performed during measurement intervals between two successive measurement actions.

6. The method as claimed in claim 1, wherein the DC loop current ($I_S$) is increased continuously from the minimum value to the maximum value ($I_{SM}$).

7. The method as claimed in claim 1, wherein the DC loop current ($I_S$) is increased incrementally from the minimum value to the maximum value ($I_{SM}$).

8. The method as claimed in claim 7, wherein each step in DC loop current is held until the measured input voltage ($U_E$) across the internal resistance (110, 120) of the transducer (100) remains constant.

9. The method as claimed in claim 1, wherein an indication is given if the threshold value at the transducer (100) is not reached.

10. The method as claimed in claim 1, wherein a DC-compensated AC signal is used to signal to means for measured-value processing and visualization in the control area if the threshold value is not reached.

* * * * *